United States Patent
Saito et al.

(10) Patent No.: US 7,329,909 B2
(45) Date of Patent: Feb. 12, 2008

(54) NITRIDE SEMICONDUCTOR DEVICE

(75) Inventors: Wataru Saito, Kawasaki (JP); Ichiro Omura, Yokohama (JP); Kouhei Morizuka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 27 days.

(21) Appl. No.: 11/149,208

(22) Filed: Jun. 10, 2005

(65) Prior Publication Data
US 2006/0170003 A1    Aug. 3, 2006

(30) Foreign Application Priority Data
Feb. 2, 2005   (JP) .......................... 2005-026295

(51) Int. Cl.
*H01L 31/00*    (2006.01)

(52) U.S. Cl. ................... 257/192; 257/E29.14
(58) Field of Classification Search ................ 257/192
See application file for complete search history.

(56) References Cited

U.S. PATENT DOCUMENTS

| | | |
|---|---|---|
| 6,555,851 B2 | 4/2003 | Morizuka |
| 2001/0025965 A1 | 10/2001 | Morizuka |
| 2005/0110042 A1 | 5/2005 | Saito et al. |
| 2005/0189559 A1 | 9/2005 | Saito et al. |
| 2006/0043501 A1 | 3/2006 | Saito et al. |
| 2006/0170003 A1 | 8/2006 | Saito et al. |

FOREIGN PATENT DOCUMENTS

| | | |
|---|---|---|
| JP | 09-275226 | 10/1997 |
| JP | 2000-183466 | 6/2000 |
| JP | 2001-168111 | 6/2001 |
| JP | 2001-177190 | 6/2001 |
| JP | 2001-308108 | 11/2001 |
| JP | 2003-059948 | 2/2003 |
| JP | 2004-200248 | 7/2004 |
| WO | WO 2004-068590 | 8/2004 |

OTHER PUBLICATIONS

Shealy, James R. "Progress in Si-Based AlGaN HEMTs for RF Power Amplifiers," Silicon Monolithic Integrated Circuits in RF System, 2001 Digest of Papers 2001 Tropical Meeting, 2001, p. 166-169.*

(Continued)

*Primary Examiner*—B. William Baumeister
*Assistant Examiner*—Matthew L. Reames
(74) *Attorney, Agent, or Firm*—Oblon, Spivak, McClelland, Maier & Neustadt, P.C.

(57) ABSTRACT

A multi-layered structure in which a p-3C-SiC layer 102 is formed above a p-Si substrate 101 is formed, above which an I-GaN layer (channel layer) 103, an n-AlGaN layer (barrier layer) 104 are formed. A source electrode 201, a drain electrode 202, and a gate electrode 203 are formed above the n-AlGaN layer 104. The source electrode 201 and the drain electrode 202 form an ohmic contact with the n-AlGaN layer 104. The gate electrode 203 forms a Schottky junction with the n-AlGaN layer 104.

20 Claims, 16 Drawing Sheets

OTHER PUBLICATIONS

Robert F. Davis, et al., "Conventional and pendeo-epitaxial growth of GaN(0001) thin films on Si(111) substractes", Journal of Crystal Growth, vol. 231, 2001, pp. 335-341.
U.S. Appl. No. 10/831,130, filed Apr. 26, 2004, Wataru Saito, et al.
U.S. Appl. No. 11/109,858, filed Apr. 20, 2005, Wataru Saito, et al.
U.S. Appl. No. 11/507,493, filed Aug. 22, 2006, Saito, et al.
U.S. Appl. No. 11/739,874, filed Apr. 25, 2007, Saito, et al.
Robert F. Davis, et al., "Conventional and pendeo-epitaxial growth of GaN(0001) thin films on Si(111) substrates", Journal of Crystal Growth, vol. 231, 2001, pp. 335-341.

* cited by examiner

NITRIDE SEMICONDUCTOR DEVICE

CROSS-REFERENCE TO THE INVENTION

This application is based upon and claims the benefit of priority from the prior Japanese Patent Application No. 2005-26295, filed on Feb. 2, 2005; the entire contents of which are incorporated herein by reference.

BACKGROUND OF THE INVENTION

1. Field of the Invention

The present invention relates to a nitride semiconductor device, used for power electrics application and the like, for instance.

2. Description of the Related Art

Conventionally, a nitride semiconductor device using a nitride has been known. Among such nitride semiconductor devices, a nitride semiconductor device using GaN has a wider band gap compared with a semiconductor device using Si. Accordingly, a device having a high critical electric field and being small in size and high in breakdown voltage is easy to be put into practice. With such a device, in semiconductor devices for power electronics application, a device with low on-state resistance and low-loss can be realized. Especially, a heterostructure field-effect transistor (HFET) using an AlGaN/GaN heterostructure can obtain an excellent characteristic with a simple device structure.

As a nitride semiconductor device having such an AlGaN/GaN heterostructure, one formed of the AlGaN/GaN heterostructure by crystal-growing on a substrate of sapphire, silicon carbide (SiC), or the like has been known (refer to Japanese Patent Laid-Open Application No. 2001-168111, for instance).

As mentioned above, in a conventional nitride semiconductor device, the AlGaN/GaN heterostructure is generally formed by crystal-growing on a substrate of sapphire, silicon carbide (SiC), or the like. Since these substrate materials have lattice constants comparatively close to that of AlGaN/GaN hetero structure, it is possible to crystal-grow film of several μm in thickness without cracks.

However, since a sapphire substrate has large thermal resistance, it has a disadvantage in that thermal radiation from the devices is difficult. On the other hand, since a SiC substrate is small in thermal resistance, it has no problem in the thermal radiation but has a disadvantage in that it is difficult to obtain a substrate with a large diameter, and even the substrate having a small diameter of 2 or 3 inches is high-priced.

Accordingly, it is conceivable to form a AlGaN/GaN heterostructure using an inexpensive and less thermal resistant silicon (Si) substrate which is easily obtainable in a large diameter to manufacture a nitride semiconductor device. However, Si and the AlGaN/GaN heterostructure differ largely in lattice constant. Therefore, cracks due to deformation is easy to generate, and on the Si substrate, only a GaN layer about 1 to about 2 μm, in thickness can be obtained by crystal growth without generating cracks. And it has a disadvantage in that since the upper limit in breakdown voltage of the GaN device on the Si substrate is determined by the thickness of the GaN layer, sufficient breakdown voltage cannot be obtained.

In a semiconductor device used for power electronics application, avalanche withstanding capability is required to be able to let electric current flow without the device being destroyed even when high voltage equal to or greater than static breakdown voltage is applied to the device to cause avalanche breakdown. In order to realize high avalanche withstanding capability, it is necessary to rapidly perform discharge of holes which are generated at the time of avalanche breakdown. For this purpose, a high concentration p-type doped layer is indispensable. However, in the nitride semiconductor device, since the activation rate of the p-type dopant is low, there is a disadvantage in that both the formation of a high-concentration p-type layer and the realizing of a high avalanche withstanding capability are difficult.

SUMMARY OF THE INVENTION

According to one mode of the present invention, provided is a nitride semiconductor device which includes a first semiconductor layer composed of $Al_xGa_{1-x}N$ ($0 \leq y \leq 1$), a second semiconductor layer including n-type or non-dope $Al_yGa_{1-y}N$ ($0 \leq y \leq 1$, x<y) formed above the first semiconductor layer, a source electrode electrically connected to the second semiconductor layer, a drain electrode electrically connected to the second semiconductor layer, and a gate electrode formed above the second semiconductor layer, in which the first semiconductor layer is formed above a laminated layer structure in which a fourth semiconductor layer including p-type 3C-SiC is formed above a third semiconductor layer including p-type Si.

DETAILED DESCRIPTION OF THE INVENTION

Figure 1:
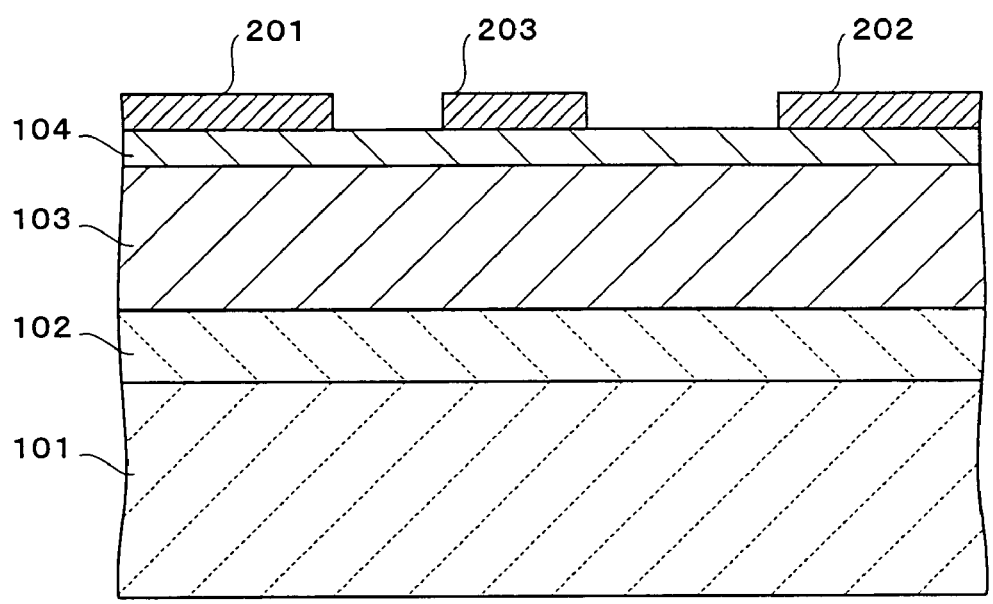
FIG. 1 is a sectional view schematically showing a structure of a first embodiment of the present invention.

Hereinafter, embodiments of the present invention will be explained referring to the drawings. Note that in the following embodiments, portions corresponding to the drawings are attached with the same numbers.

FIRST EMBODIMENT

FIG. 1 is a sectional view schematically showing a structure of a GaN heterostructure field-effect transistor (HFET) relating to a first embodiment of a nitride semiconductor device of the present invention.

As shown in the drawing, in the present embodiment, formed is a laminated structure in which a semiconductor layer (p-3C-SiC layer) 102 including p-type 3C-SiC is formed above a semiconductor layer (p-Si substrate) 101 including p-type Si, and above the laminated structure, an i-GaN layer (channel layer) 103, and an n-AlGaN layer (barrier layer) 104 to supply electrons to the channel are formed.

It should be noted that the i-GaN layer 103 corresponds to a first semiconductor layer including $Al_xGa_{1-x}N$ ($0 \leq x \leq 1$), and the n-AlGaN layer 104 corresponds to a second semiconductor layer including n-type or non-dope $Al_yGa_{1-y}N$ ($0 \leq y \leq 1$, $x<y$). It is possible to appropriately modify in a range to satisfy this condition.

A source electrode 201, a drain electrode 202, and a gate electrode 203 are formed above the n-AlGaN layer 104. The source electrode 201 and the drain electrode 202 form ohmic contact with the n-AlGaN layer 104, and electrons flow from the source electrode 201 to the drain electrode 202 via a two-dimensional electron gas (2DEG) channel formed on an AlGaN/GaN hetero interface. These source electrode 201, and drain electrode 202 are possible to form with Ti/Al and the like. Further, the gate electrode 203 forms a Schottky junction with the n-AlGaN layer 104.

Incidentally, an example of thickness of each layer is about 200 to about 250 µm for the p-Si substrate 101, about 0.5 µm for the p-3C-SiC layer 102, about 3 to about 6 µm for the i-GaN layer 103, and about 20 to about 30 nm for the n-AlGaN layer 104.

Generally, since the Si substrate cannot be an insulating substrate as distinct from a wide gap semiconductor device such as GaN, it becomes a conductive substrate. Therefore, stable operation is usually realized by fixing electric potential of the substrate such as earth connection. For this purpose, the p-Si substrate 101 is electrically connected to the source electrode 201.

In a case of the nitride semiconductor device having the above described structure, the voltage at which the electric field between the gate electrode and the drain electrode, and the electric field between the substrate and the drain electrode reach the critical electric field corresponds to the breakdown voltage of the device. Accordingly, even though the distance between the gate electrode 203 and the drain electrode 202 shown in FIG. 1 is sufficiently long, in the case of a thin i-GaN layer 103, the distance between the substrate and the drain electrode becomes short, which easily makes the electric field large, and high breakdown voltage cannot be realized.

When a GaN layer is formed above an Si substrate, the thickness of the GaN layer capable of crystal growth without generating cracks is generally about 1 µm to about 2 µm due to lattice mismatch between the Si substrate and the GaN layer. Since the critical electric field of GaN is about 3.3 MV/cm, at such a film thickness, the maximum breakdown voltage is 330 to 660V. Since a device having 600 to 1200 V in breakdown voltage is used for a high breakdown voltage device for a power source and the like, it is difficult to realize a high breakdown voltage device for power source using a Si substrate.

Therefore, in the present embodiment, as shown in FIG. 1, the p-3C-SiC layer 102 is inserted between the p-Si substrate 101 and the i-GaN layer 103 as a buffer layer. Thereby, it becomes possible to let a high quality i-GaN layer 103 crystal-grow without generating cracks, so that a thick i-GaN layer 103 (for instance, 3 to 6 µm in thickness) can be obtained to obtain a nitride semiconductor device of high breakdown voltage.

Further, the p-3C-SiC layer 102 and the p-Si substrate 101 are used in the present embodiment, and it becomes possible to realize high avalanche withstanding capability by making them p-type. In other words, when avalanche breakdown on applying high voltage, holes are generated in the i-GaN layer 103. The holes can be rapidly discharged by using the p-3C-SiC layer 102 and the p-Si substrate 101, to realize high avalanche withstanding capability.

Figure 2:
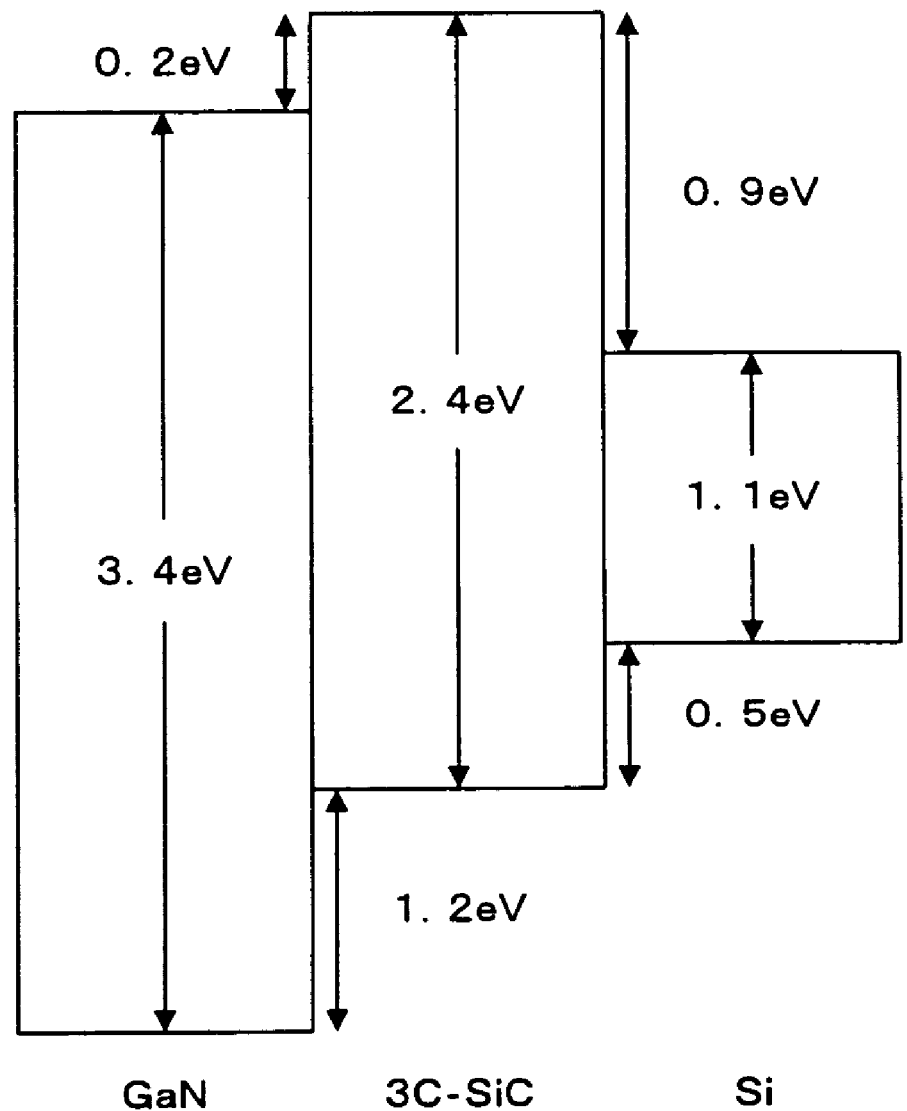
FIG. 2 is a view schematically showing a band profile of HFET relating to the first embodiment of the present invention.

A band profile of a GaN/3C-SiC/Si heterostructure is shown in FIG. 2. As shown in the drawing, in the GaN/3C-SiC/Si heterostructure, since a hetero junction to be a barrier is not formed on the valence band side, discharge of the holes is executed to perform rapidly, so that high avalanche withstanding capability can be realized.

Figure 3:
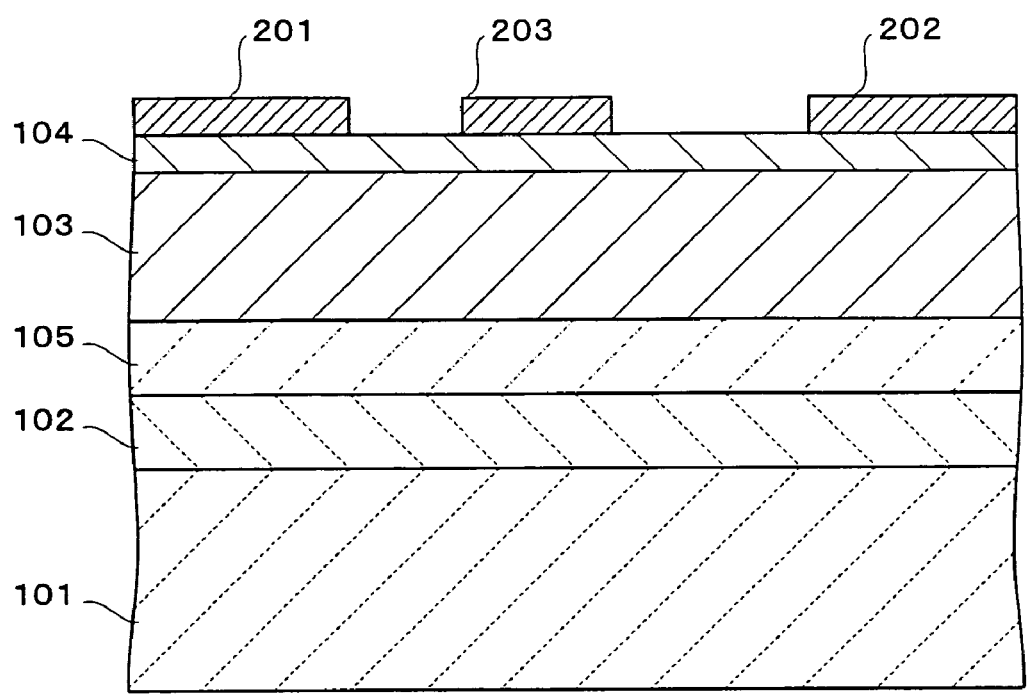
FIG. 3 is a sectional view schematically showing a structure of a modification example of the first embodiment of the present invention.

A modification example of a first embodiment will be explained next referring to FIG. 3. In a nitride semiconductor device shown in the drawing, an AlN buffer layer 105 (for instance, about 10 nm in thickness) is formed between a p-3C-SiC layer 102 and an i-GaN layer 103. When the i-GaN layer 103 is allowed to crystal-grow directly above the p-3C-SiC layer 102, Si atoms of the p-3C-SiC layer 102 diffuse, which sometimes deteriorates crystal quality of the i-GaN layer 103. Accordingly, the diffusion of Si atoms is restrained by inserting the AlN buffer layer 105 between them, so that the i-GaN layer 103 can be made high in quality.

Figure 4:
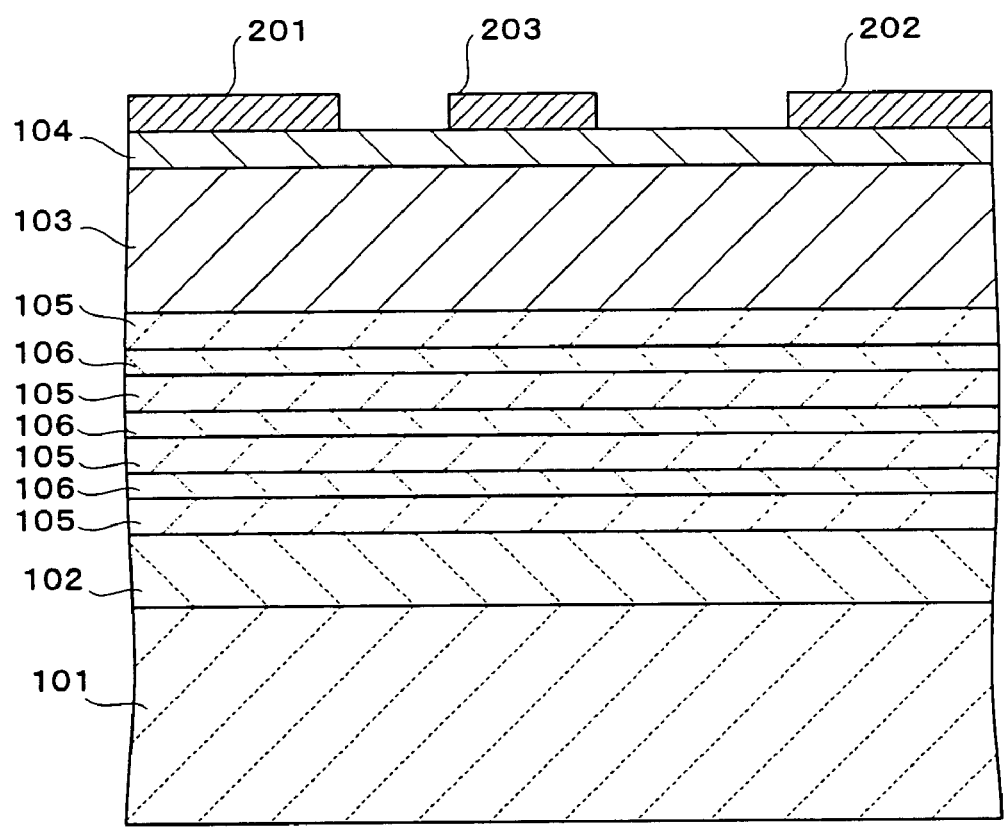
FIG. 4 is a sectional view schematically showing another modification example of the first embodiment of the present invention.

Further, the buffer layer as described above can be structured in the manner shown in FIG. 4. That is, in a nitride semiconductor device shown in FIG. 4, a multi-layered structure including the AlN layer 105 and the GaN layer 106 between the p-3C-SiC layer 102 and the i-GaN layer 3 is formed. Owing to this multi-layered structure, diffusion of Si atoms is restrained similarly to the case shown in FIG. 3, so that the i-GaN layer 103 can be made high in quality. Further, by adjusting the thicknesses of the AlN layer 105 and the GaN layer 106, it is possible to restrain stress and bending of a substrate.

SECOND EMBODIMENT

Figure 5:
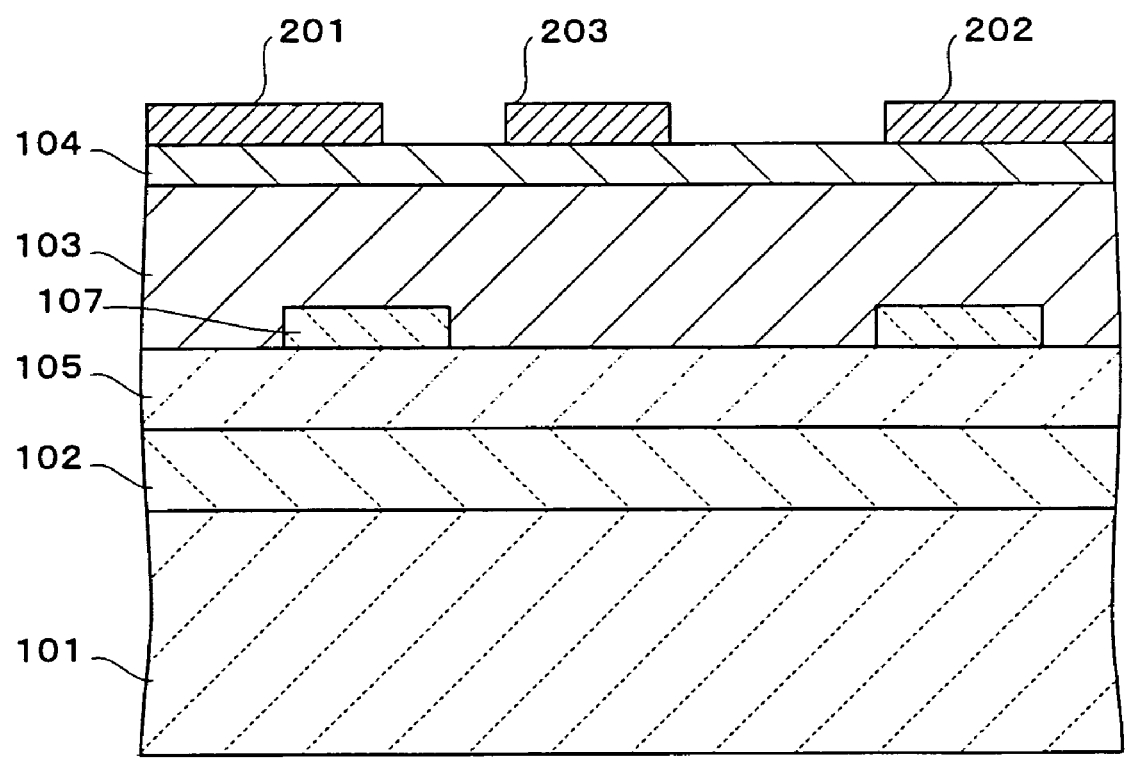
FIG. 5 is a sectional view schematically showing a structure of a second embodiment of the present invention.

FIG. 5 is a sectional view schematically showing a structure of a GaN heterostructure field-effect transistor (HFET) relating to a second embodiment of a nitride semiconductor device of the present invention.

As shown in the drawing, in the present embodiment, an AlN buffer layer 105 is formed between a p-3C-SiC layer 102 and an i-GaN layer 103, and SiN film 107 selectively formed and having apertures is provided above the AlN buffer layer 105. Thus, after forming the SiN film (mask) 107 locally provided with apertures, by performing crystal growth of the i-GaN layer 103, growth in the lateral direction of the i-GaN layer 103 is promoted, and a good quality i-GaN layer 103 is obtained. In addition, by utilizing growth in the lateral direction, lattice deformation and bending of the substrate are reduced, and a thick i-GaN layer 103 is easily produced.

Figure 6:
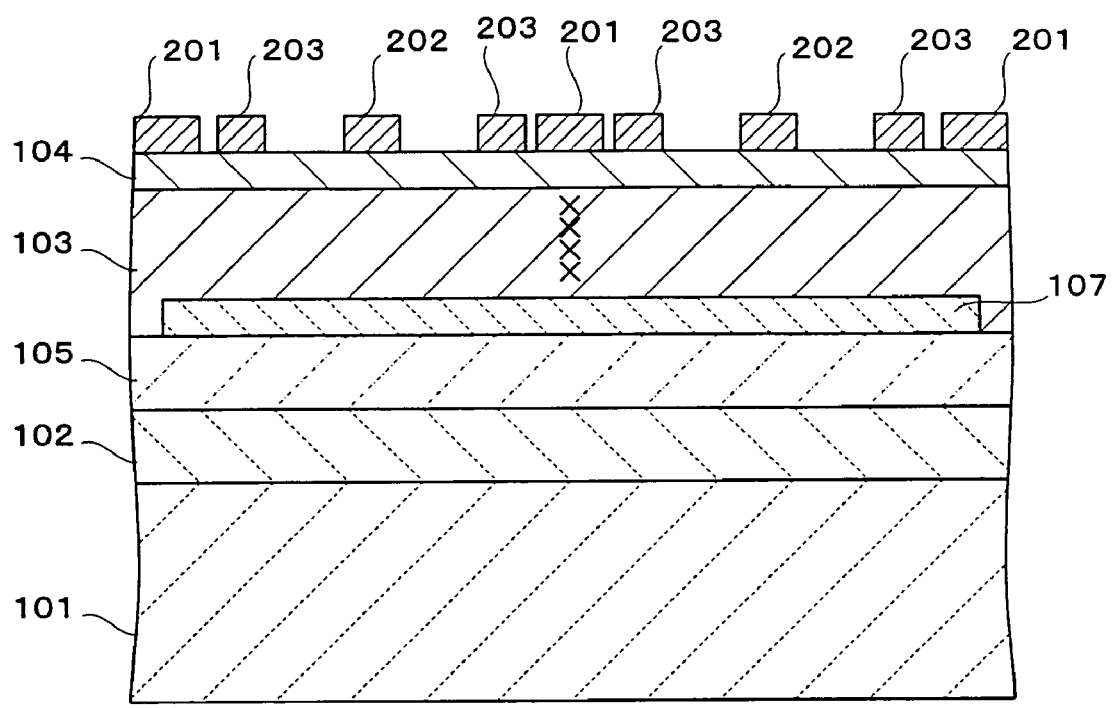
FIG. 6 is a sectional view schematically showing a structure of a modification example of the second embodiment of the present invention.

FIG. 6 shows a structure of a modification example of the above-described embodiment. In the nitride semiconductor device, the apertures of the SiN layer (mask) 107 locate only just below the source electrodes 201, and the central portions of the SiN layer 107 also locate just below the source electrodes 201. Thus, by matching the position of the apertures of the SiN layer 107 with the surface device pattern, it is possible to realize a device not easily affected by the influence of crystal defects. That is, since the i-GaN layer 103 above the SiN layer 107 is formed by growth in the lateral direction, it forms a better crystal than the SiN layer 107 at the aperture. Further, since crystals extending from the apertures of the SiN layer 107 on both sides join at the central portion of the SiN layer 107, the crystal defects (shown by x mark in the drawing) are easy to enter into the i-GaN layer 103 formed above the central portion. Accordingly, by not applying voltage to portions having poor crystal quality such as the aperture of the SiN layer 107 or the central portion of the SiN layer 107 (the portion just below the source electrode 201), it becomes possible to prevent the influence of crystal defects on device characteristics. Since the p-Si substrate 101 is electrically connected to the source electrode 201, no voltage is applied between the p-Si substrate 101 and the source electrode 201. Therefore, even crystal defect exists, no leak current flows through the crystal defect.

Figure 7:
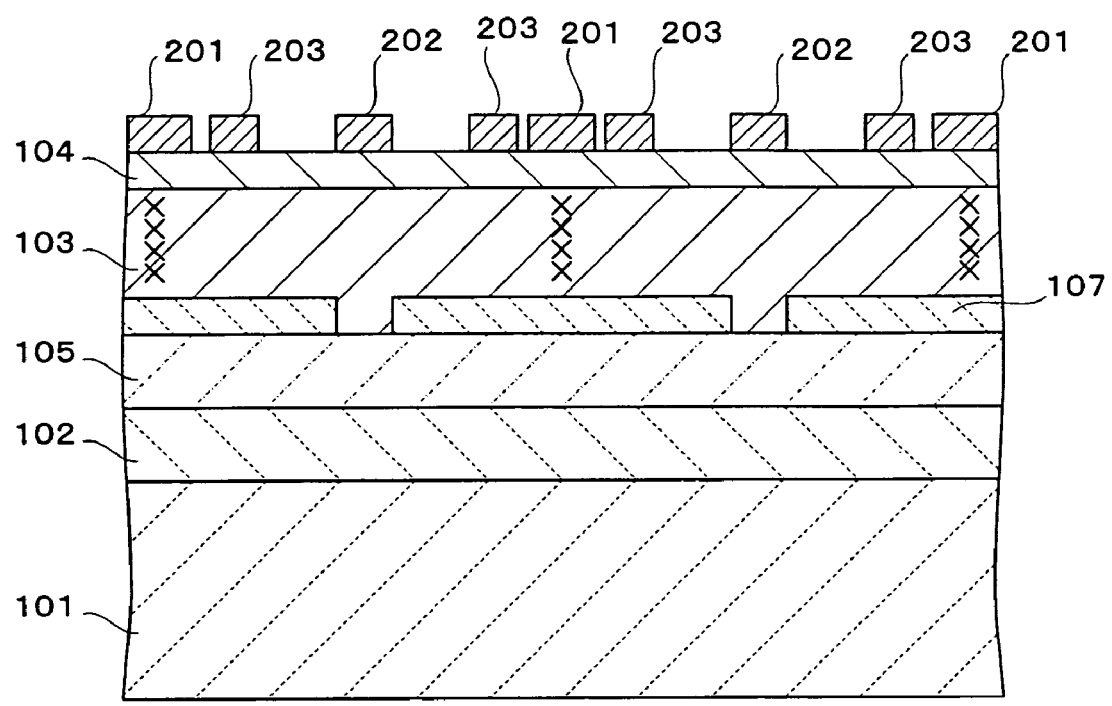
FIG. 7 is a sectional view schematically showing a structure of another modification example of the second embodiment of the present invention.

Further, it is also possible to position the aperture of the SiN layer 107 just below the drain electrode 202, as shown in FIG. 7. By positioning the aperture of the SiN layer 107 just below the drain electrode 202, discharge of holes at the time of avalanche breakdown is rapidly performed to obtain high avalanche withstanding capability. By positioning the central portion of the SiN layer 107 just below the source electrode 201, it becomes possible to remove influence of the crystal defect.

It should be noted that in the above-described embodiment, though the case of using the AlN buffer layer 105 is explained, other buffer layers can be used for crystal growth, or the i-GaN layer 103 can directly crystal-grow above the p-3C-SiC layer 102 without a buffer layer. Note that mask material and aperture pattern used for performing growth in the lateral direction of the i-GaN layer 103 are not limited to those described above.

THIRD EMBODIMENT

Figure 8:
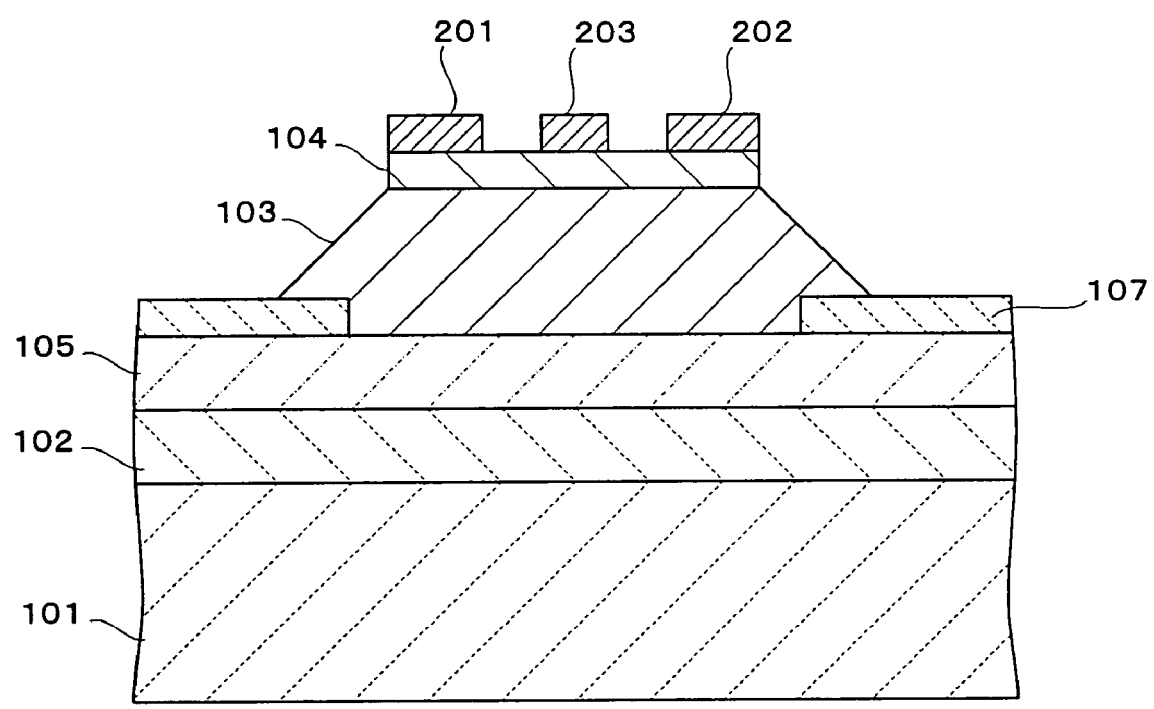
FIG. 8 is a sectional view schematically showing a structure of a third embodiment of the present invention.

FIG. 8 is a sectional view schematically showing a structure of a GaN heterostructure field-effect transistor (HFET) relating to a third embodiment of a nitride semiconductor device of the present invention.

In the embodiment shown in the drawing, an i-GaN layer 103 and an n-AlGaN layer 104 are formed in an island shape. An SiN layer (mask) 107 is formed above an AlN buffer layer 105 above a p-3C-SiC layer 102, and the i-GaN layer 103 and the n-AlGaN layer 104 are formed above the AlN buffer layer 105 and the SiN layer 107.

As in the embodiment described above, though it is possible to form the i-GaN layer 103 and the n-AlGaN layer 104 above the p-Si substrate 101, it is difficult to make a stress to be zero. Then, the stress is reduced by forming the device in an island shape as shown in FIG. 8, so that it becomes possible to reduce bending of the substrate. Note that a structure in such an island shape can be formed by selective growth in which SiN film or $SiO_2$ film is used as a mask.

It should be noted that though in the above-described embodiment, the case of using the AlN buffer layer 105 is explained, it is acceptable to achieve crystal growth using other buffer layers, or to achieve crystal growth of the i-GaN layer 103 directly above the p-3C-SiC layer 102 without such a buffer layer.

FOURTH EMBODIMENT

Figure 9:
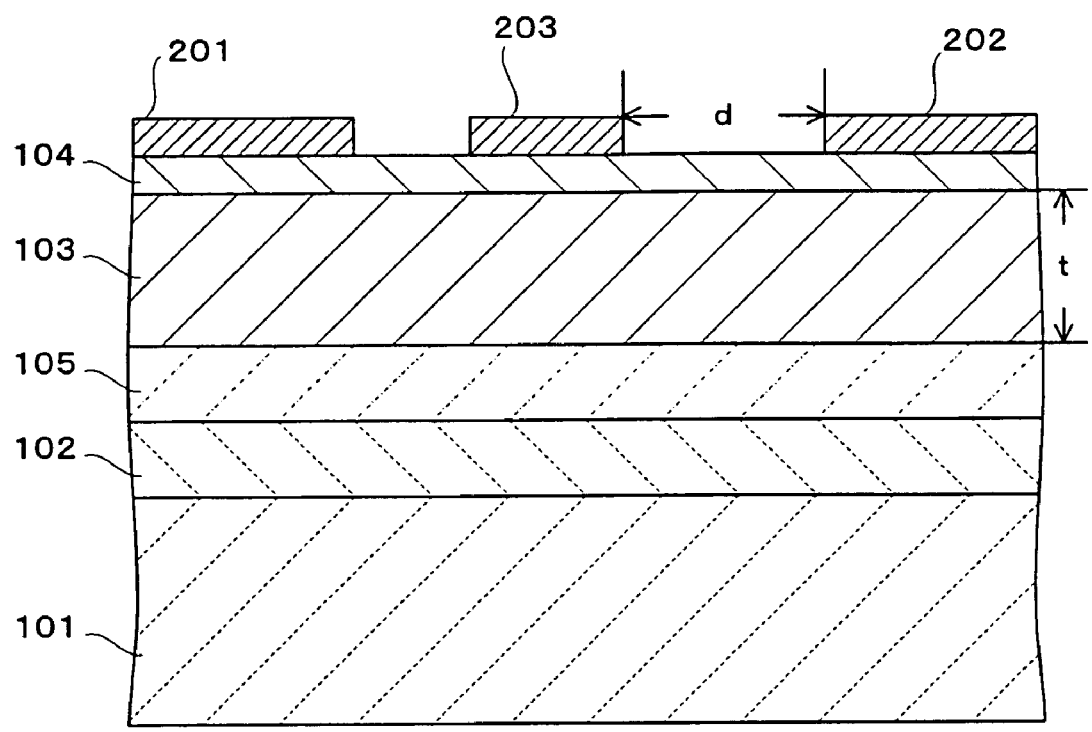
FIG. 9 is a sectional view schematically showing a structure of a fourth embodiment of the present invention.

FIG. 9 is a sectional view schematically showing a structure of a GaN heterostructure field-effect transistor (HFET) relating to a fourth embodiment of a nitride semiconductor device of the present invention. Note that portions corresponding to those in the embodiment shown in FIG. 3 are attached with the same numbers and symbols to avoid repeated explanation.

In the embodiment shown in FIG. 9, the thickness (t) of the i-GaN layer 103 is structured to be smaller than the distance (d) between the gate electrode 203 and the drain electrode 202. In the case that high voltage is applied to a device, avalanche breakdown occurs when either an electric field between the drain and the substrate or the gate and the drain reaches the critical electric field. In order to pour holes generated at the time of avalanche breakdown into the p-3C-SiC layer 102 and the p-Si substrate 101, the avalanche breakdown is required to occur between the drain and the substrate. Therefore, by making the thickness (t) of the i-GaN layer 103 smaller than the distance (d) between the gate electrode 203 and the drain electrode 202, the distance between the drain and the substrate can be made smaller than the distance between the gate and the drain, so that high avalanche withstanding capability can be realized.

FIFTH EMBODIMENT

Figure 10A:
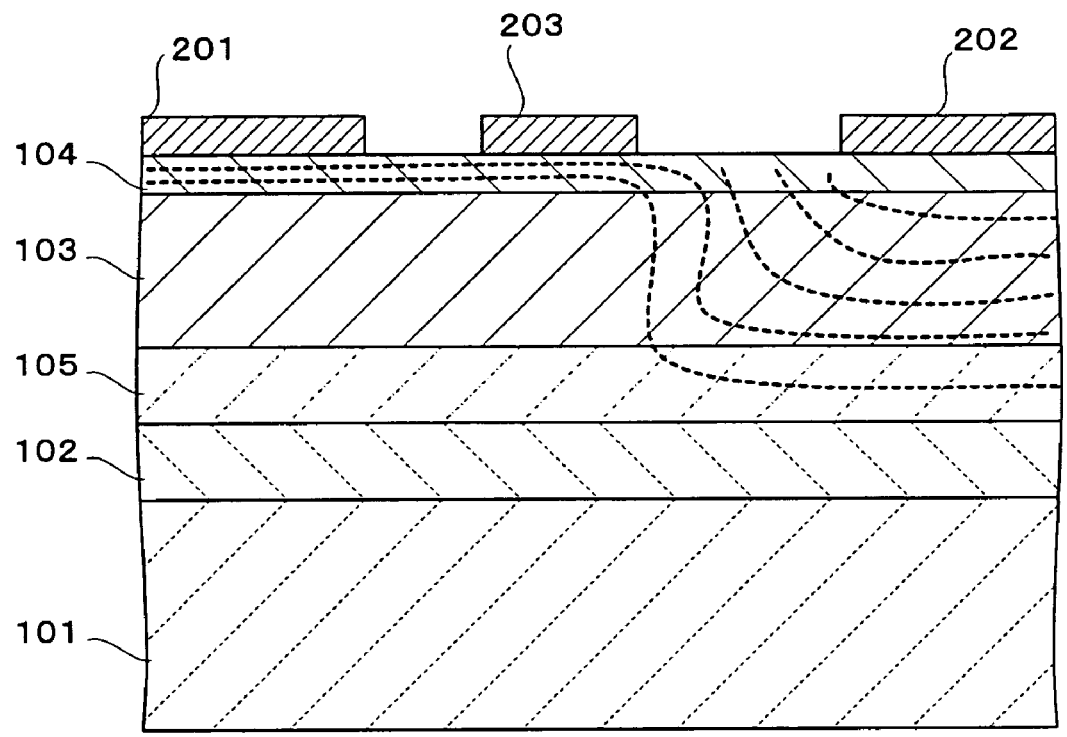
FIG. 10A and FIG. 10B are sectional views schematically showing a structure of a fifth embodiment of the present invention.
Figure 10B:
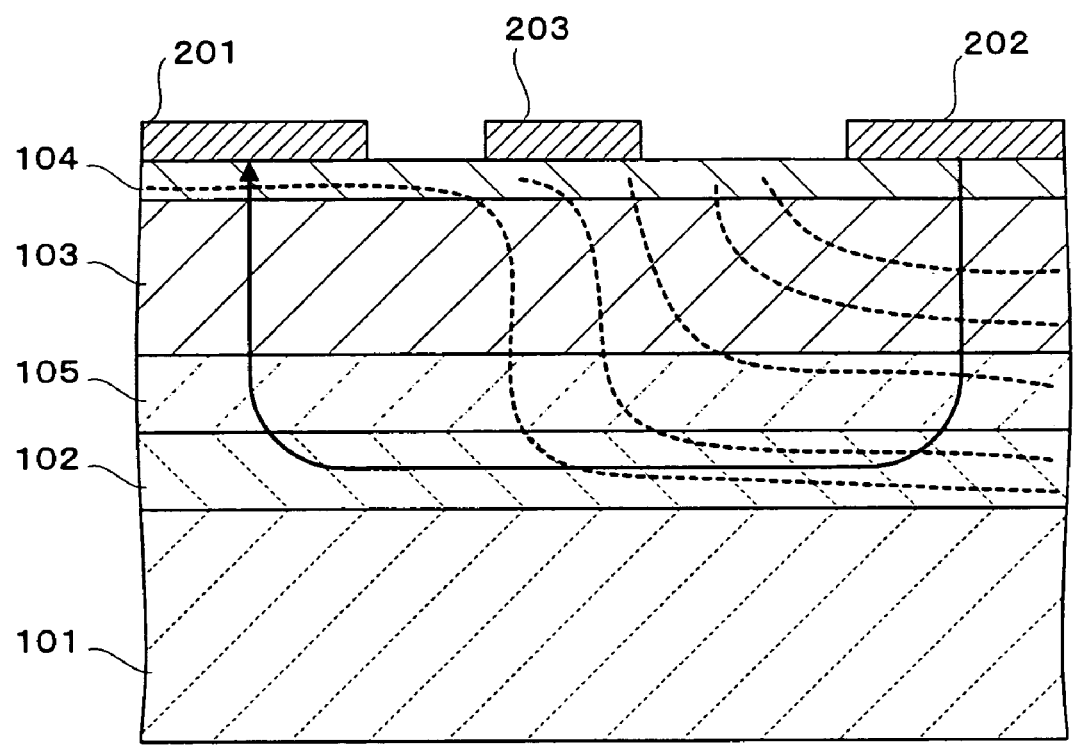

FIGS. 10A and 10B are sectional views schematically showing a structure of a GaN heterostructure field-effect transistor (HFET) relating to a fifth embodiment of a nitride semiconductor device of the present invention. Note that portions corresponding to those in the embodiment shown in FIG. 3 are attached with the same numbers and symbols to avoid repeated explanation.

The dotted lines shown in FIGS. 10A and 10B show the change in potential distribution when the impurity concentration of the p-3C-SiC layer 102 is changed. As shown in FIG. 10(*a*), when the impurity concentration of the p-3C-SiC layer 102 is high, since the p-3C-SiC layer 102 is not depleted, the electric field in the lateral direction in the p-3C-SiC layer 102 becomes zero. However, if impurity concentration of the p-3C-SiC layer 102 is low as shown in FIG. 10B, the p-3C-SiC layer 102 is depleted, and the electric field in the lateral direction is no more zero. Since voltage is applied to the p-3C-SiC layer 102 at this time, current flowing via the p-3C-SiC layer 102 is generated. This current becomes a leak current flowing at the time of applying high voltage.

In order not to generate this leak current, it is necessary to increase the impurity concentration of the p-3C-SiC layer 102 as shown in FIG. 10A. A yardstick for this purpose is found from the breakdown voltage (VB) and the thickness (t) of the i-GaN layer 103. The electrical charge Q generated between the drain and the substrate when the breakdown voltage is applied is shown by the equation Q=C×VB, where C is capacity between the drain and the substrate.

C is shown as C=ϵ/t from the thickness (t) of the i-GaN layer 103 and dielectric constant ϵ. From this, the electric charge Q becomes Q=ϵ×VB/t. When this electric charge Q is smaller than electric charge by acceptor impurity of the p-3C-SiC layer 102, the p-3C-SiC layer 102 is completely depleted, and the electric field in the lateral direction is no longer zero.

Accordingly, when electric charge of electron is q, it is necessary to make sheet impurity concentration of the p-3C-SiC layer 102 larger than ϵ×VB/(q×t). The sheet impurity concentration of the p-3C-SiC layer 102 is set in this way, generation of the leak current can be prevented.

SIXTH EMBODIMENT

Figure 11:
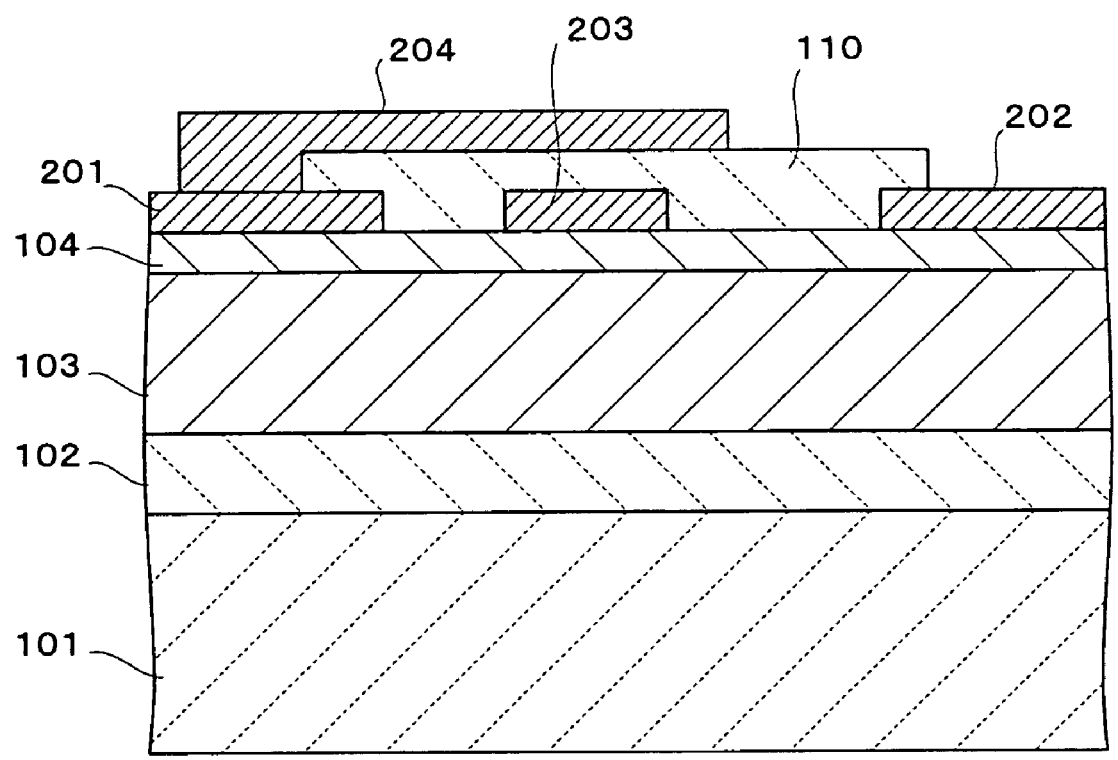
FIG. 11 is a sectional view schematically showing a structure of a sixth embodiment of the present invention.

FIG. 11 is a sectional view schematically showing a structure of a GaN heterostructure field-effect transistor (HFET) relating to a fifth embodiment of a nitride semiconductor device of the present invention. Note that portions corresponding to those in the embodiment shown in FIG. 1 are attached with the same numbers and symbols to avoid repeated explanation.

In the embodiment shown in the drawing, insulation film 110 is formed above the AlGaN layer 104, above which a field plate electrode 204 connected to a source electrode 201 is formed. The field plate electrode 204 restrains electric field concentration by covering an end portion of the gate electrode 203 to make the breakdown voltage of the device high. Note that though the field plate electrode 204 is connected to the source electrode 201 in FIG. 11, it may be connected to the gate electrode 203.

Figure 12:
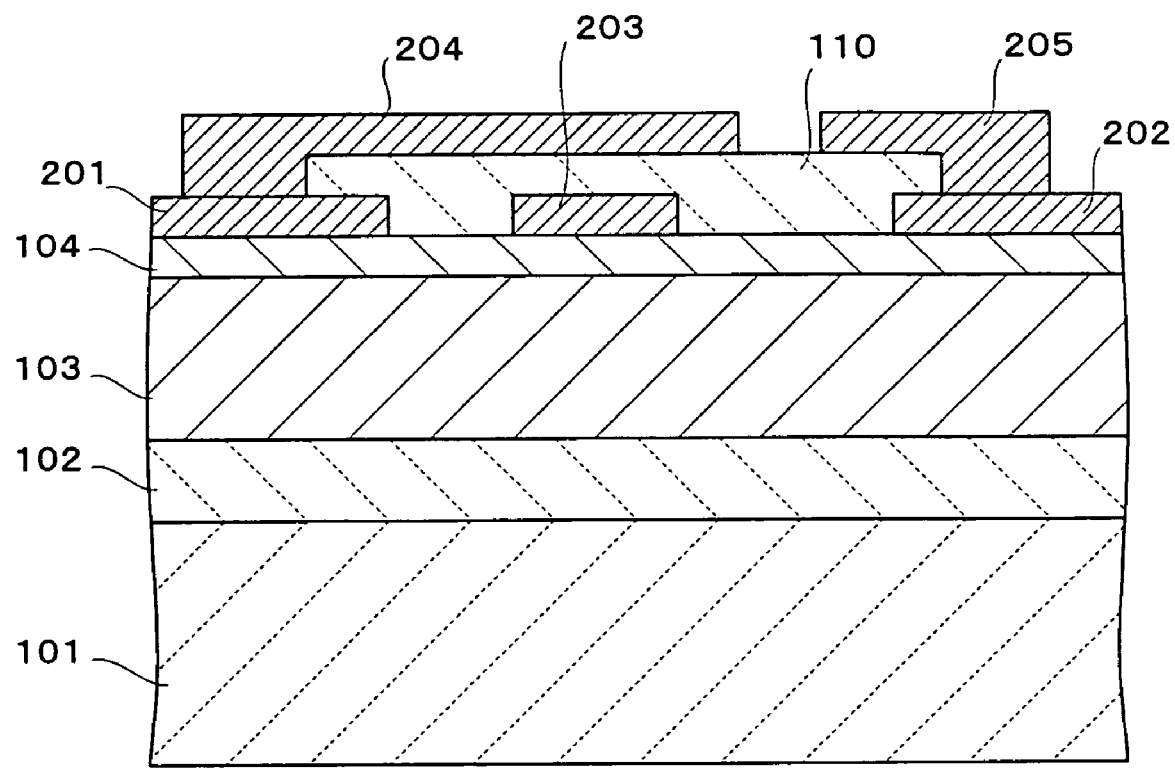
FIG. 12 is a sectional view schematically showing a structure of a modification example of the sixth embodiment of the present invention.

As shown in FIG. 12, when a second field plate electrode 205 connected to the drain electrode 202 is formed, the electric field concentration at one end of the drain electrode 202 is restrained, enabling much higher breakdown voltage.

It should be noted that the structure of the present embodiment shown in FIGS. 11 and 12 can be applied in the same manner as to that in which a buffer layer including AlN layer or AlN/GaN laminated structure is formed. Besides, in the present embodiment, it is also possible to design to realize high avalanche withstanding capability by making the thickness t of the i-GaN layer 103 smaller than the distance between the gate and drain. Further, in the present embodiment, it is also possible to structure it to restrain leak current at the time of applying high voltage by making the sheet impurity concentration of the p-3C-SiC layer 102 larger than Δ×VB/(q×t).

SEVENTH EMBODIMENT

Figure 13:
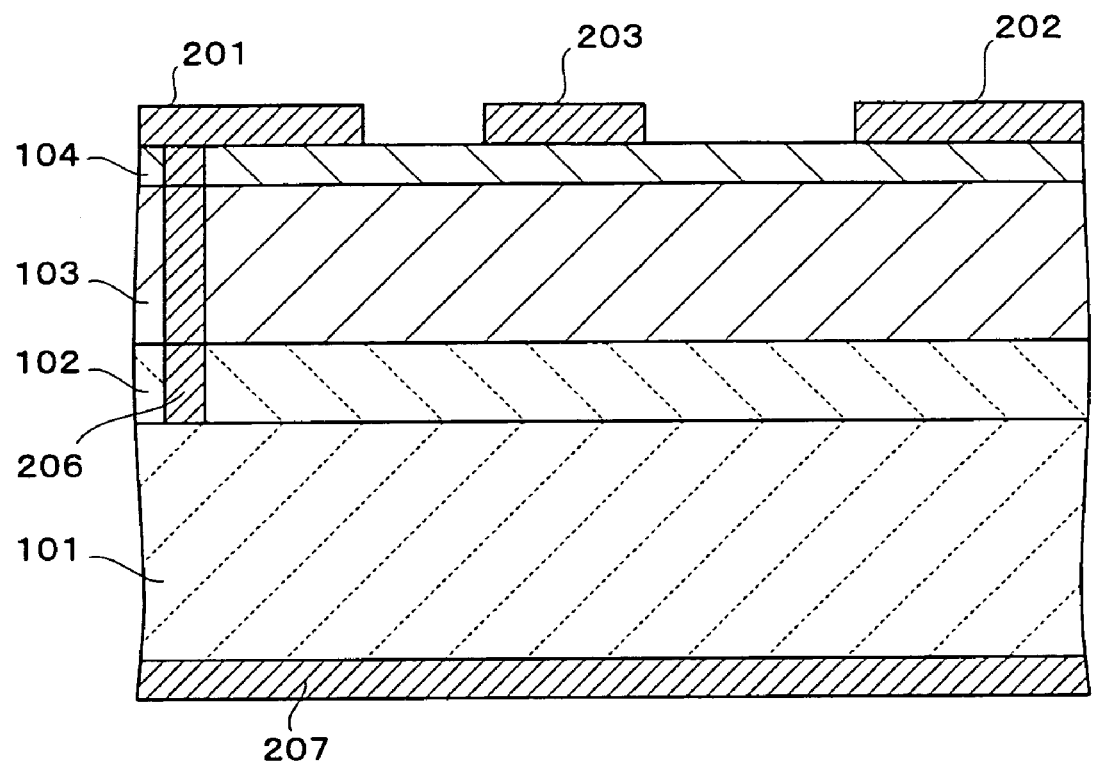
FIG. 13 is a sectional view schematically showing a structure of a seventh embodiment of the present invention.

FIG. 13 schematically shows a structure of a GaN heterostructure field-effect transistor (HFET) relating to a seventh embodiment of a nitride semiconductor device of the present invention. Note that portions corresponding to those in the embodiment shown in FIG. 1 are attached with the same numbers and symbols to avoid repeated explanation.

In the embodiment shown in the drawing, a source electrode 201 and a p-Si substrate 101 are electrically connected by forming a penetration electrode 206 penetrating through an n-AlGaN layer 104, an i-GaN layer 103, and a p-3C-SiC layer 102. Thereby, it becomes possible to take out of a source electrode 201 to the outside from a backside electrode 207 of the p-Si substrate 101. Therefore, it is not necessary to form a source electrode pad on a chip surface so that the whole chip can be effectively used. Incidentally, the penetration electrode 206 can be formed with metal or high concentration semiconductor.

Figure 14:
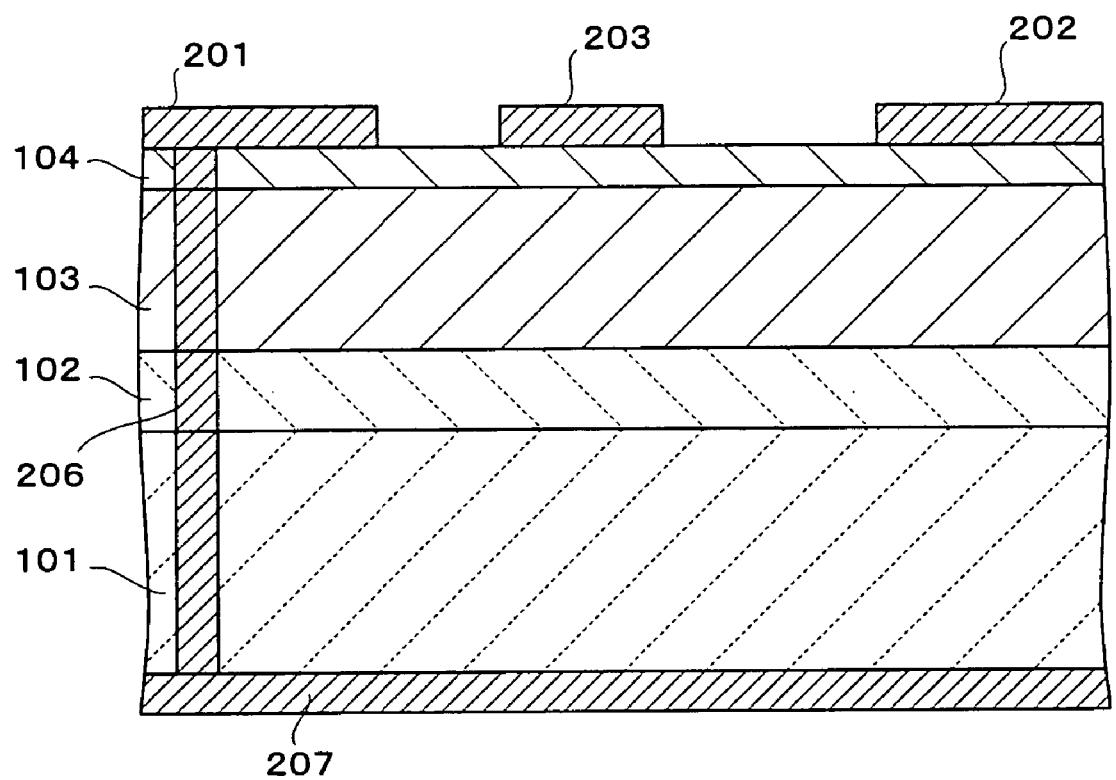
FIG. 14 is a sectional view schematically showing a structure of a modification example of the seventh embodiment of the present invention.

As shown in FIG. 14, it is possible to structure it so as to reduce pull-out resistance by forming the penetration electrode 206 to penetrate the p-Si substrate 101 also. That is, in a structure shown in FIG. 13, a resistance of the p-Si substrate 101 serves as a pull out resistance of the source electrode 201. By forming this to be a structure shown in FIG. 14, the resistance of the p-Si substrate 101 can be removed, so that the pull-out resistance can be made small. Thereby, it becomes possible to reduce on-state resistance of the chip.

Figure 15:
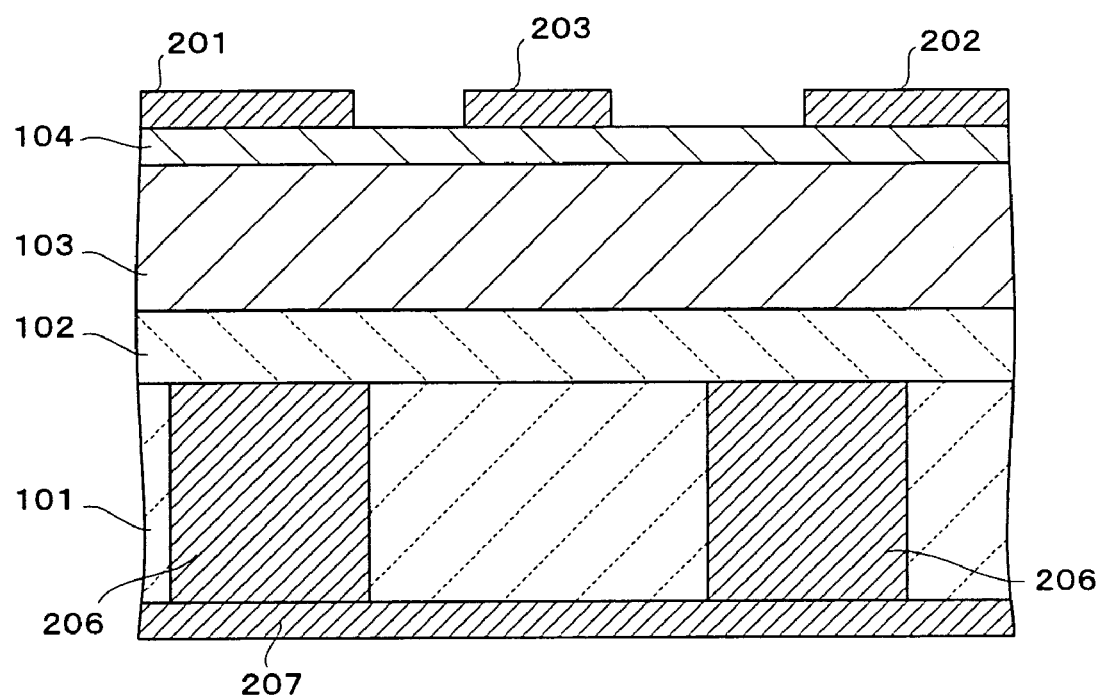
FIG. 15 is a sectional view schematically showing a structure of another modification example of the seventh embodiment of the present invention.

Further as shown in FIG. 15, a groove to penetrate through only the p-Si substrate 101 which is easy for etching is formed, in which the penetration electrode 206 is formed, and by connecting the source electrode 201 and the back side electrode 207 in the outside, a resistance of the p-Si substrate 101 can be removed from a resistance in a pull out of a hole.

As above, the present invention is explained regarding from the first embodiment to the seventh embodiment. However, this invention is not limited to the first to seventh embodiments, and various modifications other than those are available. For instance, in the above-described embodiments, the case of using i-GaN layer 103 as a channel layer is explained, but it is also possible to use the AlGaN layer as this channel layer, and to make a compositional ratio of Al smaller than the barrier layer.

In FIGS. 11 to 15, the embodiments are explained using structures in which an AlN spacer layer or an AlN/GaN multilayered spacer layer is not inserted between the p-3C-SiC layer 102 and the i-GaN layer 103, but these embodiments can be structured to insert a spacer.

It is also possible to apply the embodiments of the present invention to a case where a gate structure or a heterostructure is changed, such as a MIS gate structure or a structure having a GaN cap layer, a structure in which an AlN spacer is inserted into a hetero interface between the AlGaN layer and the GaN layer, a structure in which the thickness of the AlGaN layer differs locally, and a recess structure in which the n-GaN layer is selectively formed above the AlGaN layer, and so on.

Further, the HEFT has a gate threshold voltage in minus generally, and forms a normally-on-type device, but the present invention is not dependent on a gate threshold voltage and applicable even to a normally-off-type device.

Further, for making the HFET high in breakdown voltage, a single stage field plate structure is explained, but it is not limited to this structure, and it is also applicable to other structures for this purpose such as a multi-stage field plate structure, or a RESURF structure.

Besides, though explanation is made as to HFET, the present invention is also applicable to a device called JFET or SBD which uses only the GaN layer such as a Schottky barrier diode gate (SBD) using an AlGaN/GaN heterostructure, or a pn-diode in which a p-AlGaN layer is provided, or the like.

As explained above, according to the embodiments of the present invention, it is possible to provide a nitride semiconductor device which is excellent in thermal radiation, high in breakdown voltage and in avalanche withstanding capability, and is capable of restraining manufacturing costs.

What is claimed is:

1. A nitride semiconductor device, comprising:
   a first semiconductor layer including $Al_xGa_{1-x}N$ ($0 \leq x \leq 1$);

a second semiconductor layer including n-type or non-dope $Al_yGa_{1-y}N$ ($0 \leq y \leq 1$, $x \leq y$) formed above said first semiconductor layer;

a source electrode electrically connected to said second semiconductor layer;

a drain electrode electrically connected to said second semiconductor layer; and a gate electrode formed above said second semiconductor layer, wherein said first semiconductor layer is formed above a laminated layer structure in which a fourth semiconductor layer including p-type 3C-SiC is formed above a third semiconductor layer including p-type Si.

2. The nitride semiconductor device according to claim 1, further comprising a fifth semiconductor layer including $Al_zGa_{1-z}N$ ($0 \leq z \leq 1$) formed between said first semiconductor layer and said fourth semiconductor layer.

3. The nitride semiconductor device according to claim 1, further comprising a plurality of laminated layer structures comprising a fifth semiconductor layer including $Al_zGa_{1-z}N$ ($0 \leq z \leq 1$) and a sixth semiconductor layer including $Al_uGa_{1-u}N$ ($0 \leq u \leq 1$, $u \leq z$), which are formed between said first semiconductor layer and said fourth semiconductor layer.

4. The nitride semiconductor device according to claim 1, further comprising an insulating film selectively formed between said first semiconductor layer and said fourth semiconductor layer and having an aperture.

5. The nitride semiconductor device according to claim 4, wherein the aperture of said insulating film is formed just below said source electrode.

6. The nitride semiconductor device according to claim 4, wherein the aperture of said insulating film is formed just below said drain electrode.

7. The nitride semiconductor device according to claim 1, wherein a thickness of said first semiconductor layer is smaller than a distance between said gate electrode and said drain electrode.

8. The nitride semiconductor device according to claim 1, wherein, when a dielectric constant of said first semiconductor layer is $\epsilon$, a thickness is t, a breakdown voltage is VB, and electron charge is q, a sheet impurity concentration of said third semiconductor layer is larger than $\epsilon \times VB/(q \times t)$.

9. The nitride semiconductor device according to claim 7, further comprising:

an insulating film formed above said second semiconductor layer; and a field plate formed above said insulating film, and connected to said source electrode or said gate electrode.

10. The nitride semiconductor device according to claim 9, further comprising:

a drain field plate formed above said insulating film, and connected to said drain electrode.

11. The nitride semiconductor device according to claim 1, wherein said source electrode pierces said second semiconductor layer, said first semiconductor layer, and said fourth semiconductor layer, and is electrically connected to said third semiconductor layer.

12. The nitride semiconductor device according to claim 11, wherein said source electrode is formed to pierce through from the front surface of said second semiconductor layer to the back surface of said third semiconductor layer.

13. A nitride semiconductor device, comprising:

a first semiconductor layer including $Al_xGa_{1-x}N$ ($0 \leq x \leq 1$);

a second semiconductor layer including n-type or non-dope $Al_yGa_{1-y}N$ ($0 \leq y1$, $x \leq y$) formed above said first semiconductor layer;

a source electrode electrically connected to said second semiconductor layer;

a drain electrode electrically connected to said second semiconductor layer; and a gate electrode formed above said second semiconductor layer, wherein said first semiconductor layer is formed above a laminated layer structure in which a fourth semiconductor layer including p-type 3C-SiC is formed above a third semiconductor layer including p-type Si; and wherein said third semiconductor layer is electrically connected to said source electrode.

14. The nitride semiconductor device according to claim 13, wherein a thickness of said first semiconductor layer is smaller than a distance between said gate electrode and said drain electrode.

15. The nitride semiconductor device according to claim 13, wherein, when a dielectric constant of said first semiconductor layer is $\epsilon$, a thickness is t, a breakdown voltage is VB, and electron charge is q, sheet impurity concentration of said third semiconductor layer is larger than $\epsilon \times VB/(q \times t)$.

16. The nitride semiconductor device according to claim 14, further comprising:

an insulating film formed above said second semiconductor layer; and a field plate formed above said insulating film, and connected to said source electrode or said gate electrode.

17. The nitride semiconductor device according to claim 16, further comprising:

a drain field plate formed above said insulating film, and connected to said drain electrode.

18. The nitride semiconductor device according to claim 1, further comprising a penetration electrode for electrically connecting said source electrode and said a third semiconductor layer.

19. The nitride semiconductor device according to claim 13, further comprising a penetration electrode for electrically connecting said source electrode and said third semiconductor layer.

20. The nitride semiconductor device according to claim 18, wherein the penetration electrode penetrates the first semiconductor layer, the second semiconductor layer, the third semiconductor layer and the fourth semiconductor layer.

* * * * *